United States Patent
Peterson et al.

(10) Patent No.: US 6,559,058 B1
(45) Date of Patent: May 6, 2003

(54) METHOD OF FABRICATING THREE-DIMENSIONAL COMPONENTS USING ENDPOINT DETECTION

(75) Inventors: Jeffrey J. Peterson, Folsom, CA (US); Charles E. Hunt, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/061,501

(22) Filed: Jan. 31, 2002

(51) Int. Cl.$^7$ ............................................. H01L 21/302
(52) U.S. Cl. ......................... 438/710; 438/82; 438/77; 438/459
(58) Field of Search ........................... 438/710, 82, 77, 438/459, 149, 142; 257/75, 213

(56) References Cited

U.S. PATENT DOCUMENTS

| | | | | |
|---|---|---|---|---|
| 4,681,657 A | * | 7/1987 | Hwang et al. | 252/79.3 |
| 4,966,646 A | * | 10/1990 | Zdeblick | 216/2 |
| 5,013,681 A | * | 5/1991 | Godbey et al. | 438/459 |
| 5,413,679 A | * | 5/1995 | Godbey | 216/51 |
| 5,906,708 A | * | 5/1999 | Robinson et al. | 148/DIG. 150 |
| 5,961,877 A | * | 10/1999 | Robinson et al. | 252/79.2 |
| 5,968,710 A | * | 10/1999 | Whitman et al. | 216/38 |
| 6,064,081 A | * | 5/2000 | Robinson et al. | 257/183 |
| 6,174,820 B1 | * | 1/2001 | Habermehl et al. | 216/11 |
| 6,391,744 B1 | * | 5/2002 | Hudak et al. | 438/149 |

* cited by examiner

*Primary Examiner*—John F. Niebling
*Assistant Examiner*—Olivia Luk
(74) *Attorney, Agent, or Firm*—Park, Vaughan & Fleming LLP (57) ABSTRACT

One embodiment of the present invention provides a system for using selective etching to form three-dimensional components on a substrate. The system operates by receiving a substrate composed of a first material. Next, a second layer composed of a second material is formed on selected portions of the substrate. A third layer composed of a third material is then formed over the substrate and the second layer. Finally, an etching operation using a selective etchant is used to remove the second layer, thereby leaving the substrate, which forms a first active layer, and leaving the third layer, which forms a second active layer.

19 Claims, 5 Drawing Sheets

METHOD OF FABRICATING THREE-DIMENSIONAL COMPONENTS USING ENDPOINT DETECTION

RELATED APPLICATIONS

The subject matter of this application is related to the subject matter in co-pending non-provisional applications by the same inventors as the instant application entitled, "Method and Apparatus for Fabricating Structures Using Chemically-Selective Endpoint Detection," having U.S. Ser. No. 09/900,300, and filing date Jul. 5, 2001, "Fabricating Structures Using Chemo-Mechanical Polishing and Chemically-Selective Endpoint Detection," having U.S. Ser. No. 09/900,299, and filing date Jul. 5, 2001, and "Fabrication of Optical Components Using Si, SiGe, SiGeC, and Chemical Endpoint Detection," having Ser. No. 10/146,278, and filing date May 15, 2002.

GOVERNMENT LICENSE RIGHTS

This invention was made with United States Government support under Grant Numbers N00014-93-C-0114 and N00014-96-C-0219, awarded by the Office of Naval Research. The United States Government has certain rights in the invention.

BACKGROUND

1. Field of the Invention

The present invention relates to a process for manufacturing structures on a silicon substrate. More specifically, the present invention relates to creating three-dimensional integrated circuits through a process that uses chemically-selective endpoint detection.

2. Related Art

The dramatic advances in computer system performance during the past 20 years can largely be attributed to improvements in the processes that are used to fabricate integrated circuits. By making use of the latest fabrication processes, integrated circuit designers can presently integrate computing systems comprised of hundreds of millions of transistors onto a single semiconductor die which is a fraction of the size of a human fingernail.

Integrated circuit fabrication technology is also being used to fabricate Micro-Electro-Mechanical Systems (MEMs), such as microscopic motors and other types of actuators, that are invisible to the unaided human eye, and which have dimensions measured in fractions of microns.

A typical fabrication process builds structures through successive cycles of layer deposition and subtractive processing, such as etching. As the dimensions of individual circuit elements (or MEMs structures) continue to decrease, it is becoming necessary to more tightly control the etching operation. For example, in a typical etching process, etching is performed for an amount of time that is estimated by taking into account the time to etch through a layer to reach an underlying layer, and the time to overetch into the underlying layer. However, this process can only be controlled to +/−100 Angstroms, which can be a problem when fine control of dimensions is required.

Furthermore, conventional etching processes that indiscriminately etch all exposed surfaces are not well suited to manufacture some structures that require tighter control over subtractive processing operations. As circuit structures become smaller, there is less tolerance available to account for uncertainties in the manufacturing process.

What is needed is a process that facilitates selective etching to form integrated circuits including denser circuitry without the problems mentioned above.

SUMMARY

One embodiment of the present invention provides a system for using selective etching to form three-dimensional components on a substrate. The system operates by receiving a substrate composed of a first material. Next, a second layer composed of a second material is formed on selected portions of the substrate. A third layer composed of a third material is then formed over the substrate and the second layer. Finally, an etching operation using a selective etchant is used to remove the second layer, thereby leaving the substrate, which forms a first active layer, and leaving the third layer, which forms a second active layer.

In one embodiment of the present invention, the first material is silicon (Si), the second material is silicon-germanium (Si—Ge) or silicon-germanium-carbon (Si—Ge—C), the third material is Si, and the selective etchant is hydrofluoric/nitric/acetic (HNA) acids.

In one embodiment of the present invention, the first material is Si—Ge or Si—Ge—C, the second material is Si, the third material is Si—Ge or Si—Ge—C, and the selective etchant is tetramethylammonium hydroxide (TMAH) or potassium hydroxide ($KOH-H_2O$).

In one embodiment of the present invention, the first material is Si—Ge—C, with carbon greater than or equal to one atomic percent, and the selective etchant is TMAH or $KOH-H_2O$.

In one embodiment of the present invention, the first material is Si—Ge—C, with carbon less than or equal to one atomic percent, and the selective etchant is TMAH or $KOH-H_2O$.

In one embodiment of the present invention, the second layer is an epitaxial layer.

In one embodiment of the present invention, the third layer is an epitaxial layer.

In one embodiment of the present invention, the second layer is formed on selected portions of the substrate by first forming an epitaxial blocking structure on the substrate. Next, a patterning layer is applied over the epitaxial blocking structure. Forming the second layer on exposed portions of the substrate exposed by the patterning layer.

In one embodiment of the present invention, more than two active layers are formed by repeating the steps of forming the second layer, forming the third layer, and performing the etching operation for each additional active layer.

One embodiment of the present invention provides a system for using selective etching to form three-dimensional components on a substrate. The system operates by first receiving a substrate composed of a first material. Next, a second layer composed of a second material is formed on selected portions of the substrate. A third layer composed of a third material is then formed over selected portions of the substrate and the second layer. Next, a fourth layer composed of a fourth material is formed over third material and the remainder of the substrate and the second layer. The second, third and fourth layers are then planarized using chemo-mechanical polishing to create a planarized surface and a fifth layer is deposited. Finally, an etching operation using a selective etchant is performed to remove the second layer, thereby forming a first active layer in the substrate and a second active layer in the fifth layer, whereby the third layer and the fourth layer form vias between the first active layer and the second active layer In one embodiment of the present invention, the first material is Si, the second material is Si—Ge or Si—Ge—C, the third material is P-type Si, the fourth material is N-type Si, and the selective etchant is HNA.

In one embodiment of the present invention, the second layer is an epitaxial layer.

In one embodiment of the present invention, the second layer is formed on selected portions of the substrate by first forming an epitaxial blocking structure on the substrate. Next, a patterning layer is applied over the epitaxial blocking structure. The second layer is formed on portions of the substrate exposed by the patterning layer.

In one embodiment of the present invention, the third layer is formed on selected portions of the substrate and the second layer by first removing portions of the epitaxial blocking structure and then forming the third layer on exposed portions of the substrate and the second layer.

In one embodiment of the present invention, the fourth layer is formed by first removing the remaining portions of the epitaxial blocking structure and then forming the fourth layer over the third layer, remaining portions of the second layer, and remaining portions of the substrate.

One embodiment of the present invention provides a three-dimensional integrated circuit created using a selective etching process. The three-dimensional integrated circuit includes a substrate composed of a first material, a second layer composed of a second material on selected portions of the substrate, and a third layer composed of a third material over the substrate and the second layer. A selective etchant is used to remove the second layer, thereby forming a first active layer in the substrate of the three-dimensional integrated circuit and forming a second active layer in the third layer of the three-dimensional integrated circuit.

One embodiment of the present invention provides a three-dimensional integrated circuit created using a selective etching process. The three-dimensional integrated circuit includes a substrate composed of a first material, a second layer composed of a second material on selected portions of the substrate, and a third layer composed of a third material on selected portions of the substrate and the second layer, and a fourth layer composed of a fourth material over the third layer and the remainder of the substrate and the second layer. The second layer, third layer, and fourth layer are planarized using chemo-mechanical polishing to create a planarized surface. Next, a fifth layer composed of a fifth material is formed on the planarized surface. A selective etchant is then used to remove the second layer, thereby forming a first active layer in the substrate, and a second active layer the fifth layer, wherein the third layer and the fourth layer form vias between the first active layer and the second active layer.

In one embodiment of the present invention, an insulating layer or other material is used to back fill the second (removed) layer.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Three-Dimensional Circuit

Figure 1A:
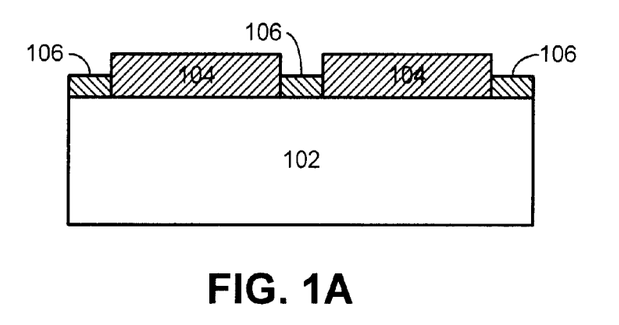
FIG. 1A illustrates substrate 102 including second layer 104 in accordance with an embodiment of the present invention.

FIG. 1A illustrates substrate 102 including second layer 104 in accordance with an embodiment of the present invention. Substrate 102 is a layer of a material such as silicon (Si) and may contain active components. Epitaxial blocking structure 106 is applied to substrate 102. Epitaxial blocking structure 106 is a material such as $SiO_2$ or SiN, which blocks epitaxial growth. Next, a photoresist layer (not shown) is applied to epitaxial blocking structure 106 and subsequently exposed through a mask. This photoresist layer is then developed to expose portions of blocking layer 106 to etching. Note that using a photoresist layer is not the only process for applying a pattern on the epitaxial blocking structure. Any suitable process for applying a pattern is equally acceptable.

A layer of material different from the material of substrate 102 is then grown on the exposed portions of substrate 102. This material can be SiGe or SiGeC. This material is selected to have different etching properties than the etching properties of the substrate so that this layer may be selectively removed in a later process. When using SiGeC, the carbon allows this layer to be grown thicker than with a layer SiGe. Both materials maintain the crystalline structure of the substrate. It is appreciated that other materials may be used.

Figure 1B:
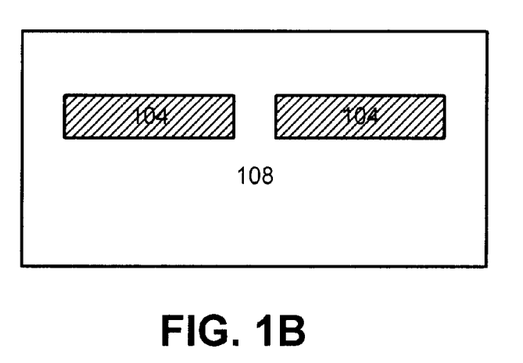
FIG. 1B illustrates three-dimensional structure 108 prior to selectively etching second layer 104 in accordance with an embodiment of the present invention.

FIG. 1B illustrates three-dimensional structure 108 prior to selectively etching second layer 104 in accordance with an embodiment of the present invention. After epitaxial second layer 104 has been formed, epitaxial blocking structure 106 is removed. Subsequently, a third layer, composed of the same material as substrate 102 or another material, is grown on the remaining portions of substrate 102 and on epitaxial second layer 104 creating three-dimensional structure 108. Second layer 104 may be a template for the crystalline structure of substrate 102 allowing the third layer to maintain the crystalline structure of substrate 102. This third layer forms a second active region for active circuitry.

Figure 1C:
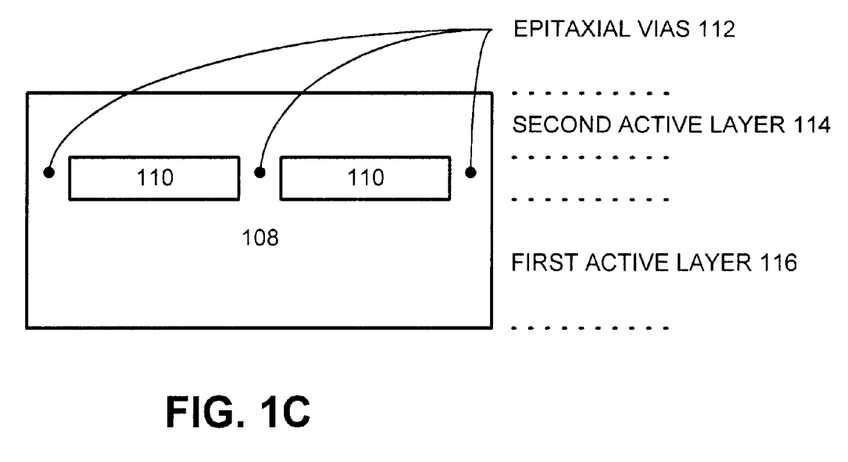
FIG. 1C illustrates three-dimensional structure 108 after selectively etching second layer 104 in accordance with an embodiment of the present invention.

FIG. 1C illustrates three-dimensional structure 108 after selectively etching second layer 104 in accordance with an embodiment of the present invention. A selective etchant, such as hydrofluoric/nitric/acetic (HNA) acids is used to selectively remove second layer 104 creating voids 110. Note that "keyholes" and other entry points into the third layer can be provided to allow the selective etchant to reach the second layer 104 during the selective etching process. Three-dimensional structure 108 includes first active layer 116 and second active layer 114 for active components. First active layer 116 and second active layer 114 are coupled through epitaxial vias 112. It is also appreciated that voids 110 may be filled with desirable materials to increase isolation, reduce leakage, etc.

Note that in general, the present invention is not limited to the above described materials and selective etchants. In general, the present invention can be used with any materials and corresponding selective etchants. For more details on selective etchants, please refer to U.S. Pat. No. 5,961,877, issued Oct. 5, 1999, entitled "Wet Chemical Etchants," which is hereby incorporated by reference to describe the selective etching process. Note further that the processes described above can be repeated to form three-dimensional structures with more than two active layers.

First Method for Creating Three-Dimensional Structures

Figure 2:
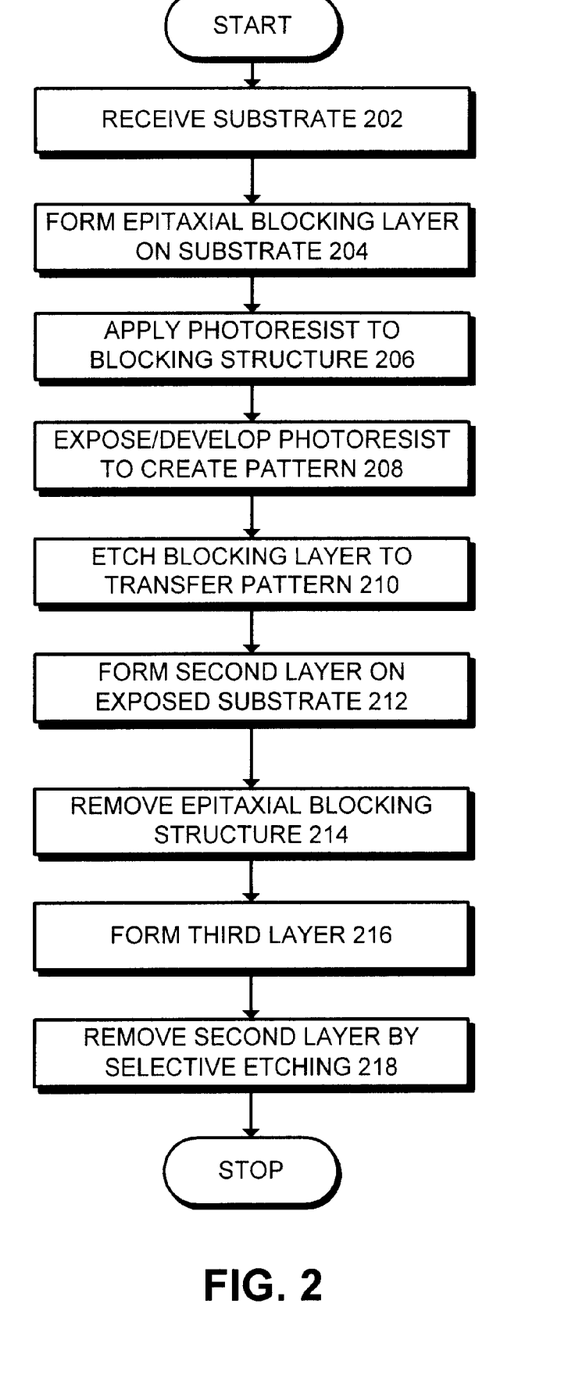
FIG. 2 is a flowchart illustrating the process of creating three-dimensional structure 108 in accordance with an embodiment of the present invention.

FIG. 2 is a flowchart illustrating the process of creating three-dimensional structure 108 in accordance with an embodiment of the present invention. The system starts when substrate 102 is received (step 202). Next, epitaxial blocking structure 106 is formed on substrate 102 (step 204). A photoresist layer is then applied to epitaxial blocking structure 106 (step 206).

This photoresist layer is exposed through a mask and developed to create a pattern for patterning second layer 104 on substrate 102 (step 208). The second layer 106 is then patterned to expose the substrate for subsequent growth of second layer 104 (step 210). Note that any suitable process for applying a pattern can be used in place of the photoresist layer. Second layer 104 is epitaxially grown on substrate 102, thereby forming a crystalline template for later growth of a third layer of the same or other material as the material of substrate 102 (step 212). Note that second layer 104 is grown using a different material than the material of substrate 102 so that second layer 104 may be selectively removed in a later process.

After forming second layer 104, the remaining portions of epitaxial blocking structure 106 are removed (step 214). A third layer is then grown on the remaining portions of the substrate and the second layer (step 216). Finally, selective etching removes the second layer using an etchant that does not remove the material of substrate 102 and the third layer (step 218). The resulting three-dimensional structure 108 includes first active layer 116 and second active layer 114 coupled together through epitaxial vias 112. Both first active layer 116 and second active layer 114 can contain active components. Note that voids 110 may be wholly or partially filled or left as void.

A Second Three-Dimensional Circuit

Figure 3A:
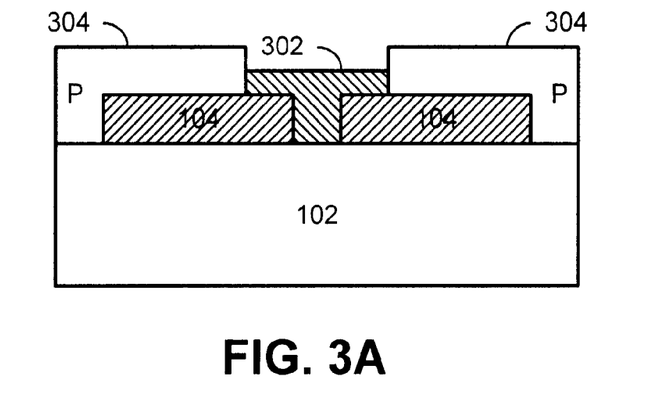
FIG. 3A illustrates substrate 102 including second layer 104 and third layer 304 in accordance with an embodiment of the present invention.

FIG. 3A illustrates substrate 102 including second layer 104 and third layer 304 in accordance with an embodiment of the present invention. Second layer 104 is epitaxially grown on substrate 102 as described above in reference to FIG. 1A. After second layer 104 has been formed, epitaxial blocking structure 106 is removed. Epitaxial blocking structure 302 is then formed over portions of the substrate and portions of second layer 104. Next, third layer 304 is epitaxially grown on the exposed portions of substrate 102 and second layer 104. Note that third layer 304 may include a dopant to create P-type material.

Figure 3B:
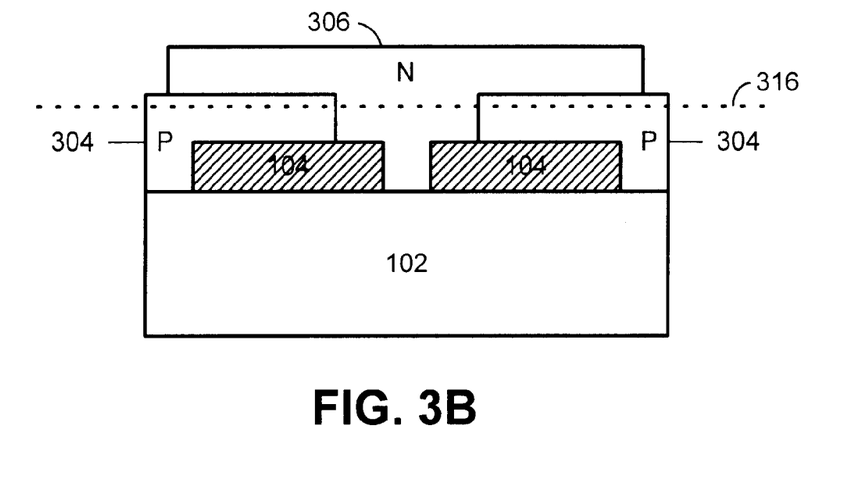
FIG. 3B illustrates substrate 102 including fourth layer 306 in accordance with an embodiment of the present invention.

FIG. 3B illustrates substrate 102 including fourth layer 306 in accordance with an embodiment of the present invention. After third layer 304 has been grown, epitaxial blocking structure 302 is removed thereby exposing the remaining portions of substrate 102 and second layer 104. Fourth layer 306 is then grown on the remaining portions of substrate 102, on remaining portions of second layer 104, and on third layer 304. Note that fourth layer 306 may include a dopant to create N-type material.

Figure 3C:
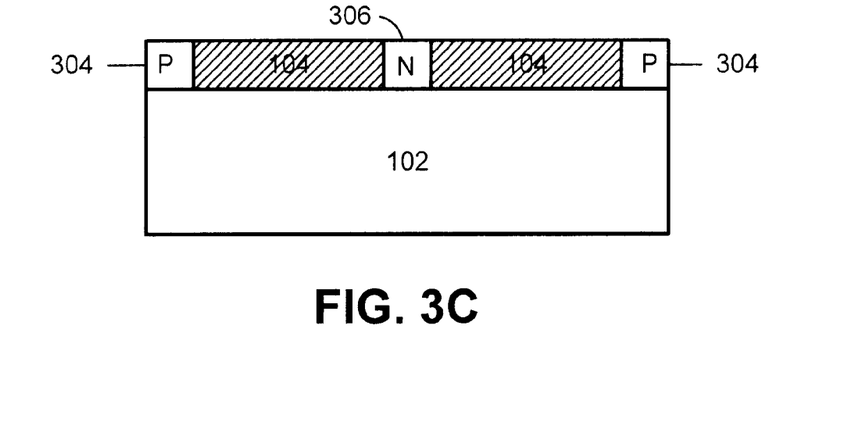
FIG. 3C illustrates the second, third, and fourth layers after planarization in accordance with an embodiment of the present invention.

FIG. 3C illustrates the second, third, and fourth layers after planarization in accordance with an embodiment of the present invention. Chemo-mechanical polishing can be used to planarize the epitaxial vias formed by third layer 304 and fourth layer 306. This planarization also exposes the surfaces of second layer 104. It is appreciated that planarization may be varied to leave portions of third layer 304 and fourth layer 306 useful for multiple active zones, well structures, etc. (see dotted line 316 in FIG. 3B).

Figure 3D:
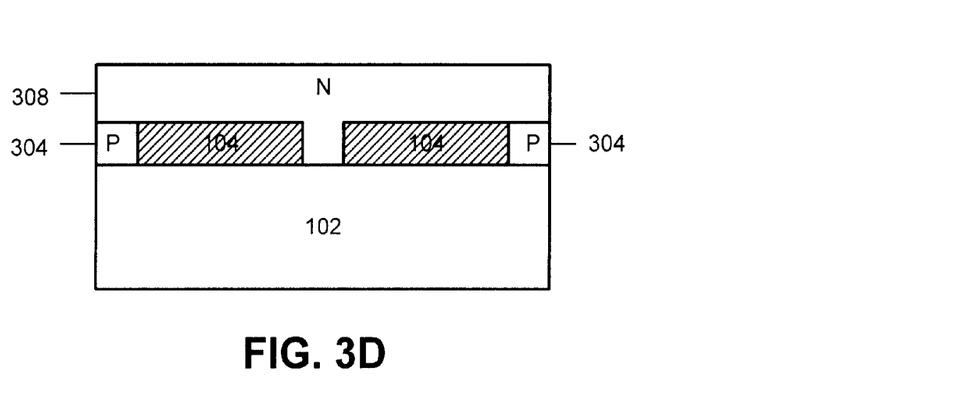
FIG. 3D illustrates substrate 102 including fifth layer 308 in accordance with an embodiment of the present invention.

FIG. 3D illustrates substrate 102 including fifth layer 308 in accordance with an embodiment of the present invention. After planarization, fifth layer 308 is epitaxially grown on second layer 104, third layer 304, and fourth layer 306, thereby maintaining the crystalline structure of substrate 102. Note that in this example fifth layer 308 is N-type material. Many combinations of materials can be used for the various layers described above depending on the unique requirements of the finished three-dimensional structure. Note also that by using combinations of P-type and N-type materials that vias 320 can form components such as diodes between the various active layers.

Figure 3E:
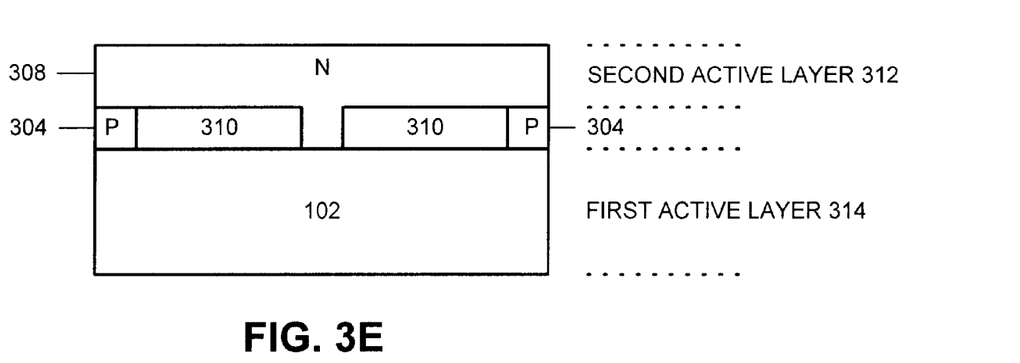
FIG. 3E illustrates a three-dimensional structure with P-type vias 304 in accordance with an embodiment of the present invention.

FIG. 3E illustrates a three-dimensional structure with P-type vias 304 in accordance with an embodiment of the present invention. A selective etchant, such as hydrofluoric/ nitric/acetic (HNA) acids is used to selectively remove second layer 104 creating voids 310. Note that "keyholes" and other entry points into fifth layer 308 can be provided to allow the selective etchant to reach the second layer 104 during the selective etching process. The resulting three-dimensional structure includes first active layer 314 and second active layer 312 for active components. First active layer 314 and second active layer 312 are coupled through P-type vias 304. Note that the processes described above in conjunction with FIGS. 3A–3E can be repeated to form three-dimensional structures with more than two active layers. Note that voids 310 may be wholly or partially filled or left void to provide isolation, reduce leakage, etc. Also note that second active layer 312 may be intrinsic.

Second Method for Creating Three-Dimensional Structures

Figure 4:
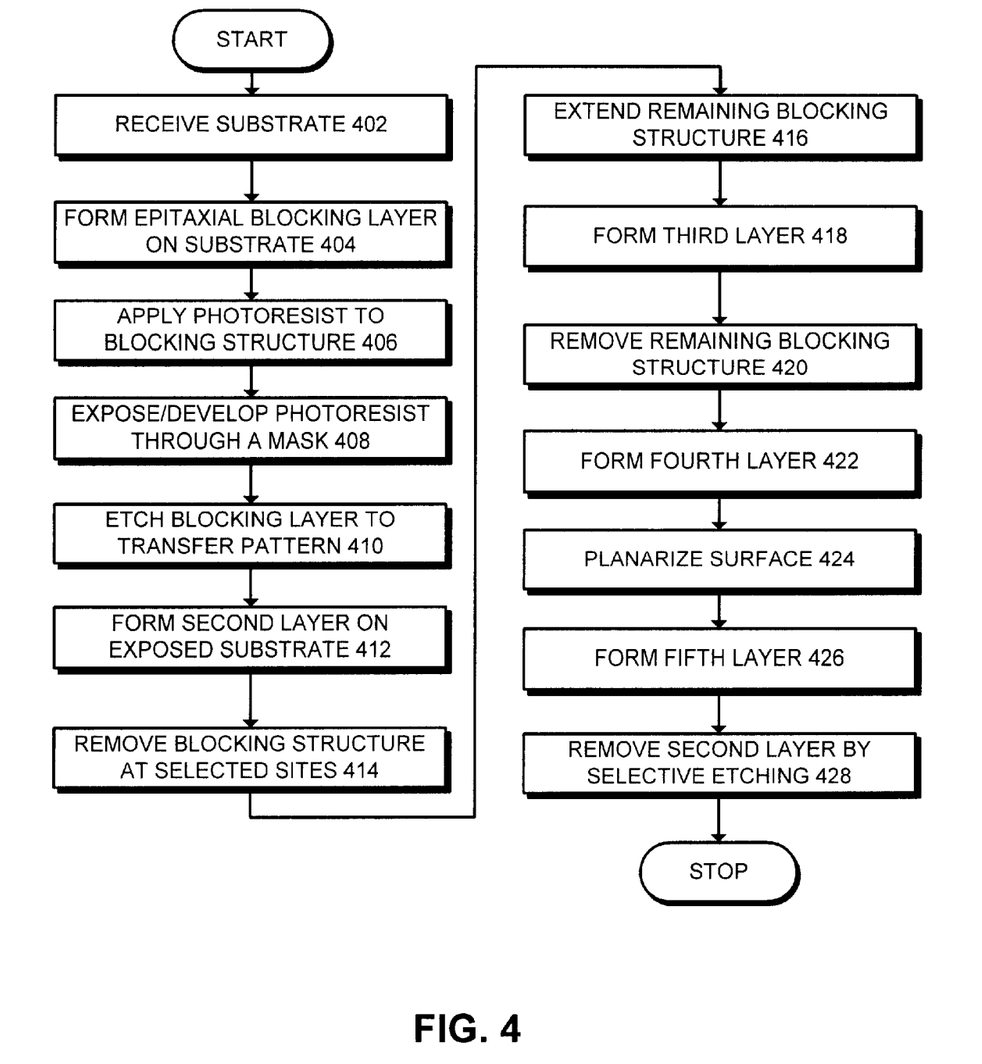
FIG. 4 is a flowchart illustrating the process of creating a three-dimensional structure with P-type vias in accordance with an embodiment of the present invention.

FIG. 4 is a flowchart illustrating the process of creating a three-dimensional structure with P-type vias in accordance with an embodiment of the present invention. The system starts when substrate 102 is received (step 402). Next, epitaxial blocking structure 106 is formed on substrate 102 (step 404). A photoresist layer is then applied to epitaxial blocking structure 106 (step 406).

This photoresist layer is exposed through a mask and developed to create a pattern for applying second layer 104 on substrate 102 (step 408). Note that any process for applying a pattern may be used. A photoresist layer is one such process. The blocking layer 106 is then etched to expose the substrate for subsequent growth of second layer 104 (step 410). Second layer 104 is epitaxially grown on substrate 102, thereby forming a crystalline template for later growth of a third layer of material (step 412). Note that second layer 104 is grown using a material with different characteristics than the material of substrate 102 so that second layer 104 may be selectively removed in a later process.

Next, selected portions of epitaxial blocking structure 106 are removed (step 414). After removing these portions of epitaxial blocking structure 106, the remaining portions of epitaxial blocking structure 106 may or may not be extended to cover portions of second layer 104 (step 416). This is shown as epitaxial blocking structure 302 in FIG. 3A. Third layer 304 is then epitaxially grown on the exposed portions of substrate 102 and on the exposed portions of second layer 104 (step 418). Note that, in this example, third layer 304 is P-type material, but other embodiments are equally likely.

After forming third layer 304, epitaxial blocking structure 302 is removed, thereby exposing the remaining portions of substrate 102 and the remaining portions of second layer 104 (step 420). Next, fourth layer 306 is epitaxially grown on the exposed portions of substrate 102 and second layer 104 and on third layer 304 (step 422). Chemo-mechanical polishing may then be used to planarize the surface of second layer 104, third layer 304, and fourth layer 306 as shown in FIG. 3C (step 424). Note that the structure may be planarized to the level indicated by the dotted line 316 in FIG. 3B to create active zones, wells, etc.

Fifth layer 308 is then epitaxially grown on this planarized surface (step 426). Note that the crystalline structure of fifth layer 308 is the same as the crystalline structure of substrate 102 because of the crystalline template effects of second layer 104. Finally, selective etching is used to remove second layer 104 (step 428). The resulting three-dimensional structure includes first active layer 314 and second active layer 312 coupled together through P-type vias 304 and a single N-type via. Both first active layer 314 and second active layer 312 can contain active components. Additionally, vias 304 can form components such as diodes with adjacent layers using a different type of material. Note that voids 310 may be wholly or partially filled or left void to provide isolation, reduce leakage, etc. Further note that second active layer 312 may be intrinsic. Note also that these examples are not intended to limit the materials and types to those described herein. A practitioner with ordinary skill in the art will be able to include other materials, which offer properties desired for specific applications.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for using selective etching to form three-dimensional components on a substrate, wherein three-dimensional components include active components on multiple active layers, comprising:

receiving the substrate composed of a first material;

forming a second layer composed of a second material on selected portions of the substrate;

forming a third layer composed of a third material over the substrate and the second layer; and performing an etching operation using a selective etchant to remove the second layer, whereby the substrate forms a first active layer and the third layer forms a second active layer;

whereby including active components on multiple active layers provides increased circuit density.

2. The method of claim 1, wherein the first material comprises Si;

wherein the second material is Si—Ge or Si—Ge—C;

wherein the third material comprises Si; and wherein the selective etchant compirses HNA.

3. The method of claim 1, wherein the first material is Si—Ge or Si—Ge—C;

wherein the second material comprises Si;

wherein the third material is Si—Ge or Si—Ge—C; and wherein the selective etchant is tetramethylammonium hydroxide (TMAH) or KOH—$H_2O$.

4. The method of claim 3, wherein the first material comprises Si—Ge—C, wherein carbon is greater than or equal to one atomic percent; and wherein the selective etchant is TMAH or KOH—$H_2O$.

5. The method of claim 3, wherein the first material comprises Si—Ge—C, wherein carbon is less than or equal to one atomic percent; and wherein the selective etchant is TMAH or KOH—$H_2O$.

6. The method of claim 1, wherein the second layer is an epitaxial layer.

7. The method of claim 1, wherein the third layer is an epitaxial layer.

8. The method of claim 1, wherein forming the second layer on selected portions of the substrate involves:

forming an epitaxial blocking structure on the substrate;

applying a patterning layer over the epitaxial blocking structure;

etching the epitaxial blocking structure so that portions of the substrate defined by the patterning layer are exposed; and forming the second layer on exposed portions of the substrate.

9. The method of claim 1, further comprising forming more than two active layers by repeating the steps of forming the second layer, forming the third layer, and performing the etching operation to form each additional active layer.

10. A three-dimensional integrated circuit created using a selective etching process, wherein the three-dimensional integrated circuit includes active components on multiple active layers, the selective etching process comprising:

receiving a substrate composed of a first material;

forming a second layer composed of a second material on selected portions of the substrate;

forming a third layer composed of a third material over the substrate and the second layer; and performing an etching operation using a selective etchant to remove the second layer, whereby the substrate forms a first active layer of the three-dimensional integrated circuit and the third layer forms a second active layer of the three-dimensional integrated circuit;

whereby including active components on multiple active layers provides increased circuit density.

11. The three-dimensional integrated circuit of claim 10, wherein the first material comprises Si;

wherein the second material is Si—Ge or Si—Ge—C;

wherein the third material comprises Si; and wherein the selective etchant comprises HNA.

12. The three-dimensional integrated circuit of claim 10, wherein the first material is Si—Ge or Si—Ge—C;

wherein the second material comprises Si;

wherein the third material is Si—Ge or Si—Ge—C; and wherein the selective etchant is tetramethylammonium hydroxide (TMAH) or KOH—H$_2$O.

13. The three-dimensional integrated circuit of claim 12, wherein the first material comprises Si—Ge—C, wherein carbon is greater than or equal to one atomic percent; and wherein the selective etchant is TMAH or KOH—H$_2$O.

14. The three-dimensional integrated circuit of claim 12, wherein the first material comprises Si—Ge—C, wherein carbon is less than or equal to one atomic percent; and wherein the selective etchant is TMAH or KOH—H$_2$O.

15. The three-dimensional integrated circuit of claim 10, wherein the second layer is an epitaxial layer.

16. The three-dimensional integrated circuit of claim 10, wherein the third layer is an epitaxial layer.

17. The three-dimensional integrated circuit of claim 10, wherein forming the second layer on selected portions of the substrate involves:

forming an epitaxial blocking structure on the substrate;

applying a patterning layer over the epitaxial blocking structure;

etching the epitaxial blocking structure so that portions of the substrate defined by the patterning layer are exposed; and forming the second layer on exposed portions of the substrate.

18. The three-dimensional integrated circuit of claim 10, the selective etching process further comprising forming more than two active layers by repeating the steps of forming the second layer, forming the third layer, and performing the etching operation to form each additional active layer.

19. A three-dimensional integrated circuit created using a selective etching process, wherein the three-dimensional integrated circuit includes active components on multiple active layers, comprising:

a substrate composed of a first material;

a second layer composed of a second material on selected portions of the substrate; and a third layer composed of a third material over the substrate and the second layer;

wherein a selective etchant is used to remove the second layer, whereby the substrate forms a first active layer of the three-dimensional integrated circuit and the third layer forms a second active layer of the three-dimensional integrated circuit;

whereby including active components on multiple active layers provides increased circuit density.

* * * * *